(12) United States Patent
Jiang et al.

(10) Patent No.: US 12,423,308 B2
(45) Date of Patent: Sep. 23, 2025

(54) ADAPTIVE COMPRESSION/DECOMPRESSION IN DISTRIBUTED DATABASE APPLICATION

(71) Applicant: International Business Machines Corporation, Armonk, NY (US)

(72) Inventors: Peng Hui Jiang, Beijing (CN); Sheng Yan Sun, Beijing (CN); Xiao Xiao Chen, Beijing (CN); Bing Jiang Sun, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/452,980

(22) Filed: Aug. 21, 2023

(65) Prior Publication Data

US 2025/0068634 A1   Feb. 27, 2025

(51) Int. Cl.
   *G06F 11/34*   (2006.01)
   *G06F 16/2455*   (2019.01)
(52) U.S. Cl.
   CPC .... *G06F 16/24561* (2019.01); *G06F 11/3409* (2013.01); *G06F 11/3452* (2013.01)
(58) Field of Classification Search
   CPC ........... G06F 16/24561; G06F 11/3409; G06F 11/3452
   See application file for complete search history.

(56) References Cited

U.S. PATENT DOCUMENTS

| | | | |
|---|---|---|---|
| 7,417,943 B2 | 8/2008 | Mutch | |
| 7,636,363 B2 | 12/2009 | Chang et al. | |
| 7,930,436 B1 | 4/2011 | Znosko | |
| 9,621,186 B2 | 4/2017 | Nam et al. | |
| 10,013,170 B1* | 7/2018 | Sahin | G06F 3/0631 |
| 2010/0303146 A1* | 12/2010 | Kamay | H04N 21/2662 |
| | | | 375/E7.126 |
| 2012/0109908 A1* | 5/2012 | Barsness | G06F 16/21 |
| | | | 707/693 |
| 2019/0238154 A1 | 8/2019 | Muralimanohar et al. | |
| 2021/0034598 A1* | 2/2021 | Arye | G06F 16/288 |

(Continued)

FOREIGN PATENT DOCUMENTS

CN   105718538 B   6/2016

OTHER PUBLICATIONS

Devarajan, H. et al., "An Intelligent, Adaptive, and Flexible Data Compression Framework", 19th IEEE/ACM International Symposium on Cluster, Cloud and Grid Computing (CCGRID), May 17, 2019, pp. 82-91, IEEE, United States.

(Continued)

*Primary Examiner* — Kannan Shanmugasundaram
(74) *Attorney, Agent, or Firm* — Gavin Giraud

(57) ABSTRACT

In several aspects, a computing device analyzes data to determine its characteristics. The computing device selects at least one compression process based on the characteristics. A compression switch and a compression level are dynamically adjusted based on multiple factors including available system resources, desired storage savings and performance requirement. The compression level dynamically varies depending on the data being processed and a workload on a system. Performance of compression and decompression operations are continuously monitored for dynamically adjusting compression parameters to optimize performance.

20 Claims, 9 Drawing Sheets

(56) References Cited

U.S. PATENT DOCUMENTS

2022/0058100 A1\* 2/2022 Selegean ............. G06F 11/3082
2023/0022619 A1  1/2023 Jiang et al.

OTHER PUBLICATIONS

Sucu, S. et al., "Ace: A Resource-Aware Adaptive Compression Environment", International Conference on Information Technology: Coding and Computing (ITCC03), Apr. 30, 2003, pp. 1-6, United States.
Devarajan, H. et al., "HCompress: Hierarchical Data Compression for Multi-Tiered Storage Environments", International Parallel and Distributed Processing Symposium (IPDPS), May 22, 2020, pp. 557-566, IEEE, United States.
Fuzong, W., et al., "Dynamic Data Compression Algorithm Selection for Big Data Processing on Local File System", CSAI '18: Proceedings of the 2018 2nd International Conference on Computer Science and Artificial Intelligence, Dec. 8, 2018, pp. 110-114, Association for Computing Machinery, United States.
International Searching Authority, "Notification of Transmittal of the International Search Report and the Written Opinion of the International Searching Authority, or Declaration," Patent Cooperation Treaty, Oct. 22, 2024, 9 pages, International Application No. PCT/EP2024/072155.

\* cited by examiner

90

Analyzing, By A Computing Device, Data to Determine its Characteristics
91

Selecting at Least one Compression Process Based on the Characteristics
92

Dynamically Adjusting a Compression Switch and a Compression Level Based on a Plurality of Factors Comprising Available System Resources, Desired Storage Savings, and Performance Requirement, wherein the Compression Level Dynamically Varies Depending on the Data Being Processed and the Workload on the System
93

Continuously Monitoring Performance of Compression and Decompression Operations for Dynamically Adjusting Compression Parameters to Optimize Performance
94

FIG. 8

ADAPTIVE COMPRESSION/DECOMPRESSION IN DISTRIBUTED DATABASE APPLICATION

BACKGROUND

The field of embodiments of the present invention relates to adaptive compression/decompression for distributed database applications.

Compression techniques aim to reduce the storage space required for data. Achieving higher compression ratios, however, often comes at the cost of increased central processing unit (CPU) utilization and processing time during compression and decompression operations. When data needs to be transferred across the network in a distributed database system, compressed data can help reduce the amount of data transmitted. Compression and decompression operations, however, add additional processing overhead during data transfer.

SUMMARY

Embodiments relate to adaptive compression/decompression for distributed database applications. One embodiment provides a method including analyzing, by a computing device, data to determine characteristics of the data. The computing device selects at least one compression process based on the characteristics. A compression switch and a compression level are dynamically adjusted based on multiple factors including available system resources, desired storage savings, and performance requirement. The compression level dynamically varies depending on the data being processed and a workload on a system. Performance of compression and decompression operations are continuously monitored for dynamically adjusting compression parameters to optimize performance.

A computer system and a computer program product configured to perform the above-described method are also disclosed herein.

These and other features, aspects and advantages of the present embodiments will become understood with reference to the following description, appended claims and accompanying figures.

BRIEF DESCRIPTION OF THE DRAWINGS

FIG. 8 illustrates a process for providing adaptive compression and decompression for distributed database applications, according to an embodiment.

DETAILED DESCRIPTION

Figure 1:
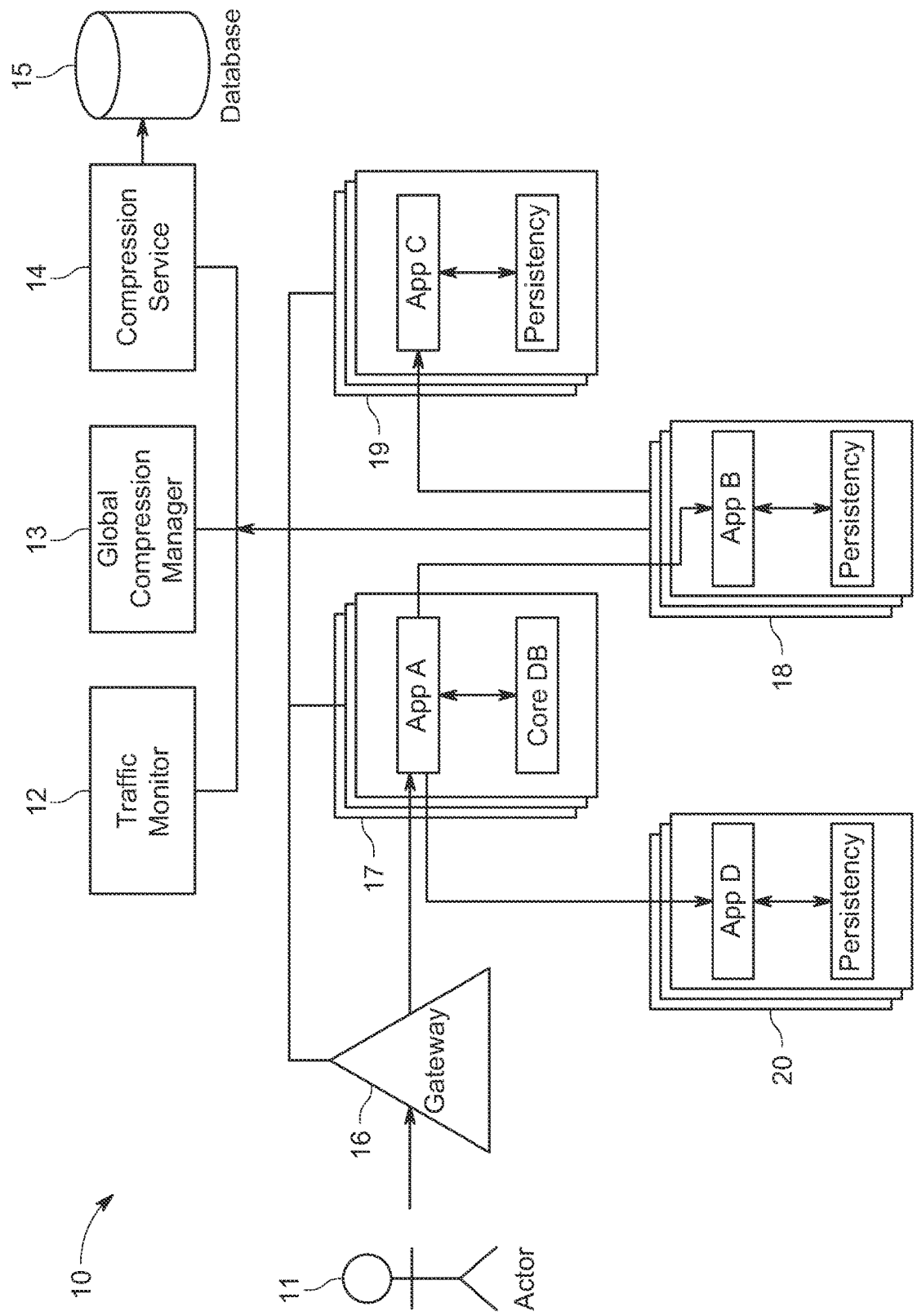
FIG. 1 illustrates a distributed database system architecture, according to some embodiments.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments relate to adaptive compression/decompression for distributed database applications. One embodiment provides a method including analyzing, by a computing device, data to determine characteristics of the data. The computing device selects at least one compression process based on the characteristics. A compression switch and a compression level are dynamically adjusted based on multiple factors including available system resources, desired storage savings, and performance requirement. The compression level dynamically varies depending on the data being processed and a workload on a system. Performance of compression and decompression operations are continuously monitored for dynamically adjusting compression parameters to optimize performance. A computer system and a computer program product configured to perform the above-described method are also disclosed herein.

One or more embodiments significantly improve optimization of the utilization of system resources across multiple systems involved in the compression and decompression process. This helps ensure that the overall resource usage is balanced, and no system is overloaded or underutilized. Some embodiments identify opportunities for system costs such as bandwidth and resource optimization by understanding these system costs associated with data transfer, compression, and decompression across systems. One or more embodiments identify bottlenecks or areas of inefficiency by factoring in the system costs associated with data transfer and compression/decompression operations. Some embodiments provide for optimizing the utilization of system resources across multiple systems involved in the compression and decompression process. This helps ensure that the overall resource usage is balanced, and no system is overloaded or underutilized. Some embodiments identify opportunities for cost optimization by understanding the costs associated with data transfer, compression, and decompression across systems. Some embodiments significantly improve identification of bottlenecks or areas of inefficiency by factoring in the costs associated with data transfer and compression/decompression operations. The system provides for dynamically adjusting the compression switch and level based on the characteristics of the data and distributed database systems, which ensures global optimization instead of unfair cost.

One or more of the following features may be included. In some embodiments, the characteristics comprise data type, distribution, and statistical properties, and the characteristics provide information for compressibility potential of the data.

In one or more embodiments, the plurality of factors comprises available system resources, desired storage savings, and performance requirement.

In some embodiments, the continuously monitoring of the performance of the compression and the decompression operations provide analysis for the plurality of factors.

In one or more embodiments, the plurality of factors comprises central processing unit (CPU) utilization, storage savings, data transfer system usage, and query response times.

In some embodiments, a global compression manager controls where and how to compress from a whole system perspective.

In one or more embodiments, the global compression manager depends on characteristics of system setup, network conditions, and the at least one compression process to dynamically apply adaptive compression, and the data characteristics change over time.

In a distributed database system, data is often distributed across multiple nodes or shards. Applying compression and decompression algorithms in a parallel and distributed manner introduces additional complexities. The challenge is how to achieve the trade-off between storage space savings and the computational and transfer overhead required for compression and decompression, especially in distributed database system where data is transferred from side to another side.

FIG. 1 illustrates a distributed database system architecture 10, according to some embodiments. In one or more embodiments, the architecture 10 includes a gateway 16 that receives input from an actor/user 11, a system traffic monitor 12, a global compression manager 13, a compression service 14, database 15, multiple instances of App A and core database (or DB) 17, multiple instances of App B and persistency 18, multiple instances of App C and persistency 19, and multiple instances of App D and persistency 20. In some embodiments, the architecture 10 dynamically adjusts the compression switch and level based on the characteristics of the data and distributed database systems. The architecture 10 further analyzes the data to determine its characteristics, such as data type, distribution, and statistical properties and selects an appropriate compression algorithm/process or a combination of algorithms/processes that best suit the data's characteristics. In one or more embodiments, the architecture 10 adjusts the compression level based on factors such as available system resources, desired storage savings, and performance requirements. The architecture further continuously monitors the performance of the compression and decompression operations, and analyzes factors such as CPU utilization, storage savings, data transfer time and bandwidth costs, and query response times. The architecture 10 additionally controls where and how to compress by the global compression manager 13 by calculating the system costs of compression/decompression, storage saving, network bandwidth, etc. and provides for the system to adaptively (or dynamically) adjust the compression location, parameters, or algorithms/processes as the data characteristics change over time.

Figure 2:
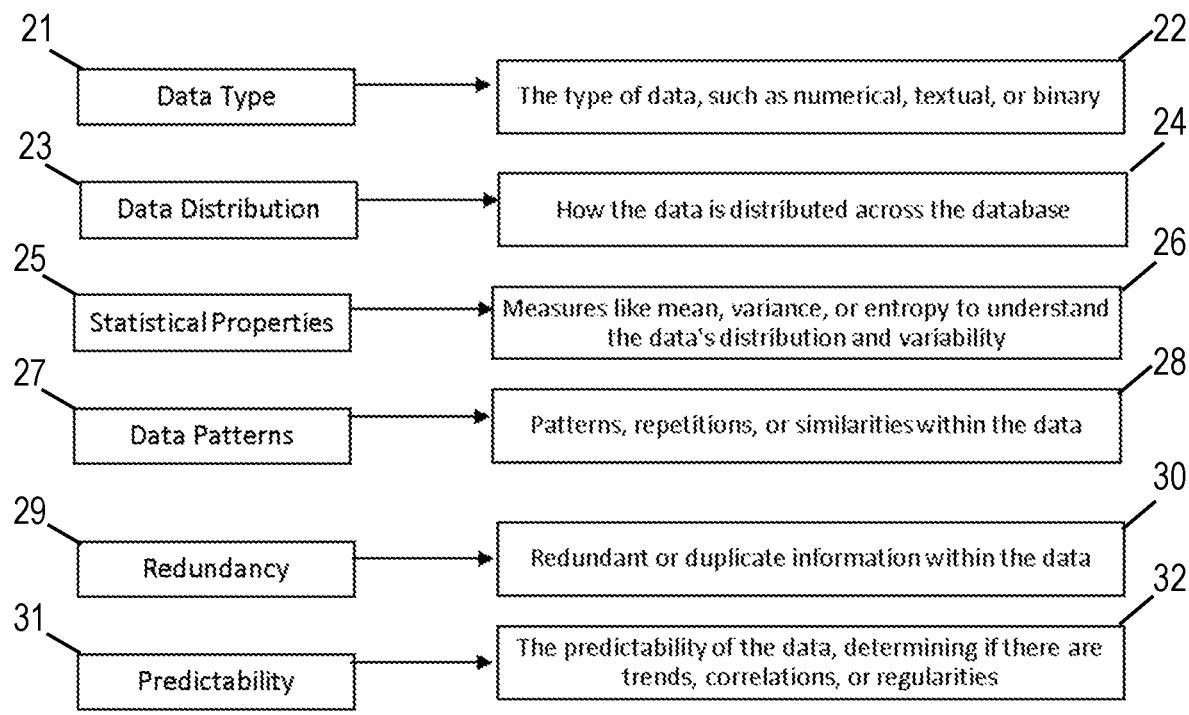
FIG. 2 illustrates a data analysis portion of the distributed database system, according to some embodiments.

FIG. 2 illustrates a data analysis portion of the distributed database system, according to some embodiments. The distributed database system analyzes the data to determine its characteristics, such as data type, distribution, and statistical properties. This analysis helps in understanding the compressibility potential of the data. In one or more embodiments, the data analysis portion includes data type 21 where the analysis determines in block 22 the type of data such as numerical, textual, or binary. Data distribution 23 is analyzed to determine in block 24 how the data is distributed across the database(s). Statistical properties 25 is analyzed to determine in block 26 measures such as mean, variance, or entropy to understand the data's distribution and variability. Data patterns 27 is analyzed to determine in block 28 patterns, repetitions, or similarities within the data. Redundancy 29 is analyzed in block 30 to identify redundant or duplicate information within the data. Predictability 31 is analyzed in block 32 to determine the predictability of the data based on determining if there are trends, correlations, or regularities.

Figure 3:
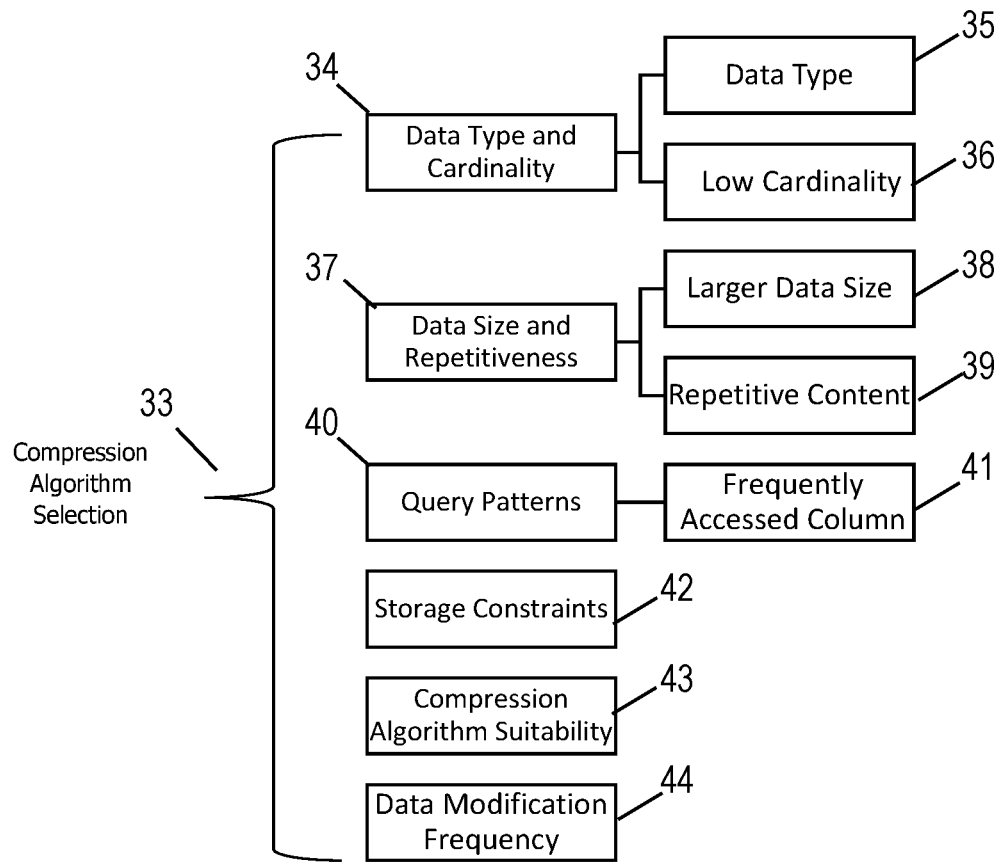
FIG. 3 illustrates a compression process selection portion of the distributed database system, according to some embodiments.

FIG. 3 illustrates a compression process selection portion 33 of the distributed database system, according to some embodiments. Based on the data analysis (FIG. 2), the system selects an appropriate compression algorithm/process or a combination of algorithms/processes that best suit the data's characteristics. In some embodiments, different algorithms/processes, such as LZ77, Huffman coding, arithmetic coding, etc., may be employed. In one or more embodiments, the compression selection algorithm/process 33 utilizes the information from block 34 data type and cardinality, block 37 data size and repetitiveness, block 40 query patterns, block 42 storage constraints, block 43 compression algorithm/process suitability, and block 44 data modification frequency. In some embodiments, block 34 data type and cardinality uses the information from block 35 data type and block 36 low cardinality. Block 37 data size and repetitiveness uses information from block 38 larger data size and block 39 repetitive content. Block 40 query patterns uses information from block 41 frequently accessed column.

Figure 4:
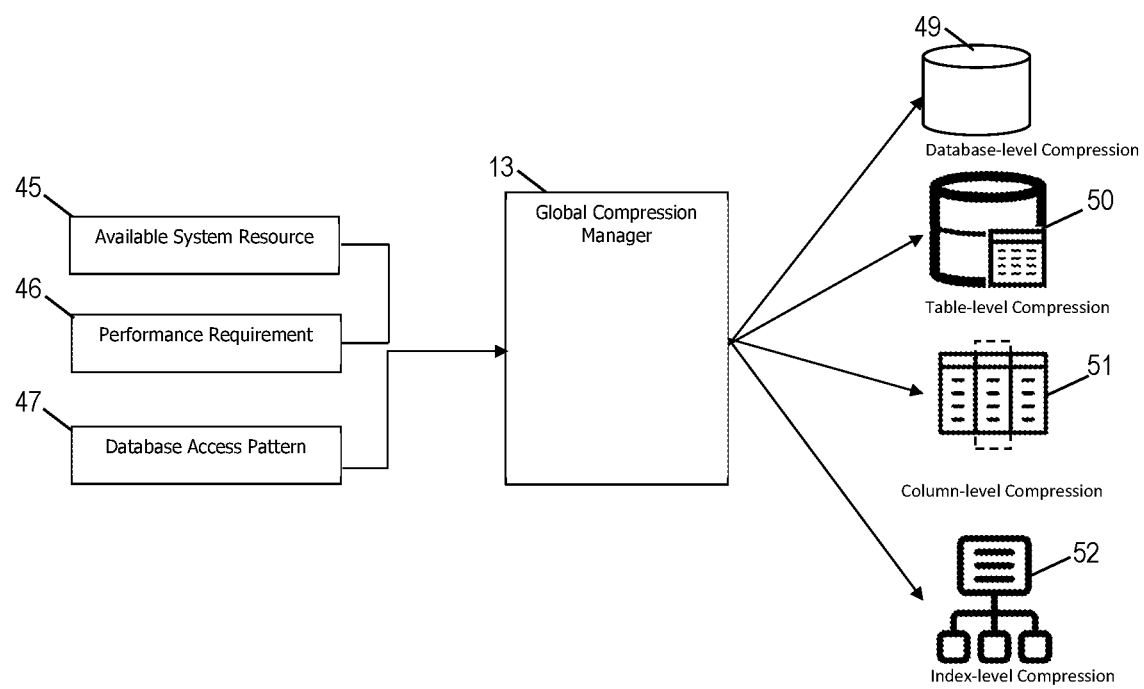
FIG. 4 illustrates a compression level determination portion of the distributed database system, according to some embodiments.

FIG. 4 illustrates a compression level determination portion of the distributed database system, according to some embodiments. In one or more embodiments, the compression level determination portion includes block 45 for available system resource processing, block 46 performance requirement processing, block 47 database access pattern processing, and a global compression manager 13. The global compression manager 13 manages compression at various levels, including database-level compression 49, table-level compression 50, column-level compression 51 and index-level compression 52.

In some embodiments, the global compression manager 13 controls where and how to compress from the whole system's perspective. The adaptive nature of the global compression manager 13 processing provides for the distributed database system to adaptively adjust the compression location, parameters or algorithms/processes as the data characteristics change over time. In one or more embodiments, to determine where to compress, where to decompress, and estimate the required bandwidth, the following is implemented: Bandwidth Required=(Data Size)/(Compression Time)+(Decompression Time), where data size refers to the size of the data that needs to be compressed and transmitted. Compression time represents the time it takes to compress the data at the source. Decompression time is the time required to decompress the data at the destination. By dividing the data size by the compression time, the rate at which the compressed data will be transmitted can be estimated. Adding the decompression time to this rate provides an estimation of the required bandwidth.

Figure 5:
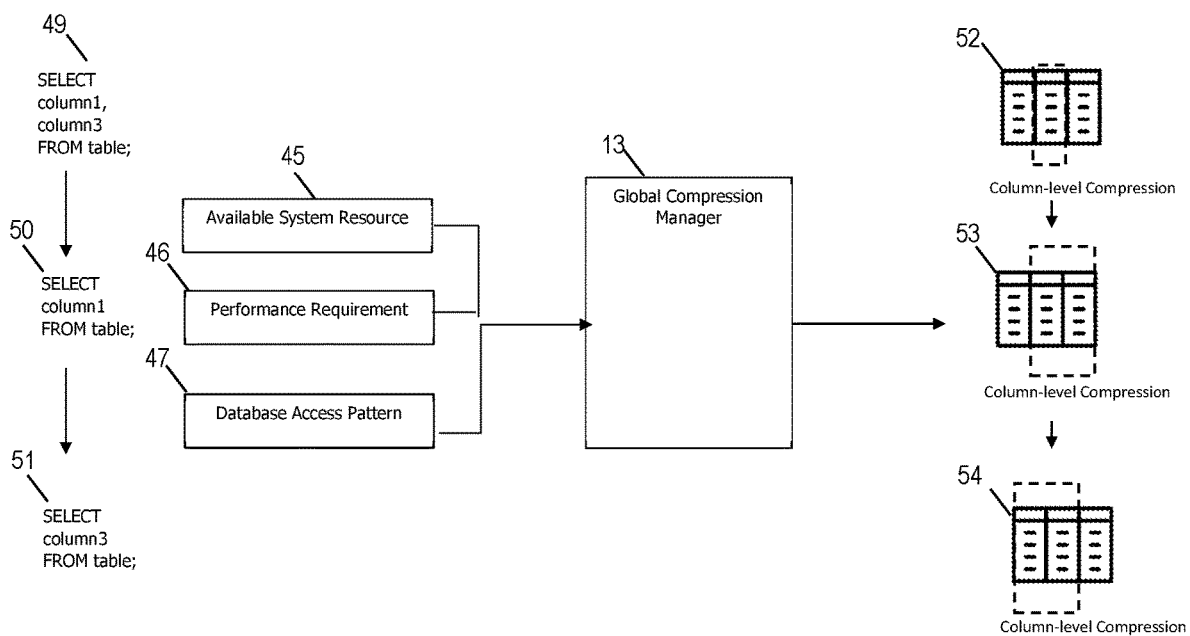
FIG. 5 illustrates an example for the compression level determination portion of the distributed database system, according to some embodiments.

FIG. 5 illustrates an example for the compression level determination portion of the distributed database system, according to some embodiments. In one or more embodiments, the global compression manager 13 uses the information from block 45 available system resource, block 46 performance requirement and block 47 database access pattern. In this example, the global compression manager 13 determines to: select column 1 and column 3 from a database table (reference 49) and performs column-level compression 52; select column 1 from a database table (reference 50) and performs column-level compression 53; and select column 3 from a database table (reference 51) and performs column-level compression 54.

Figure 6:
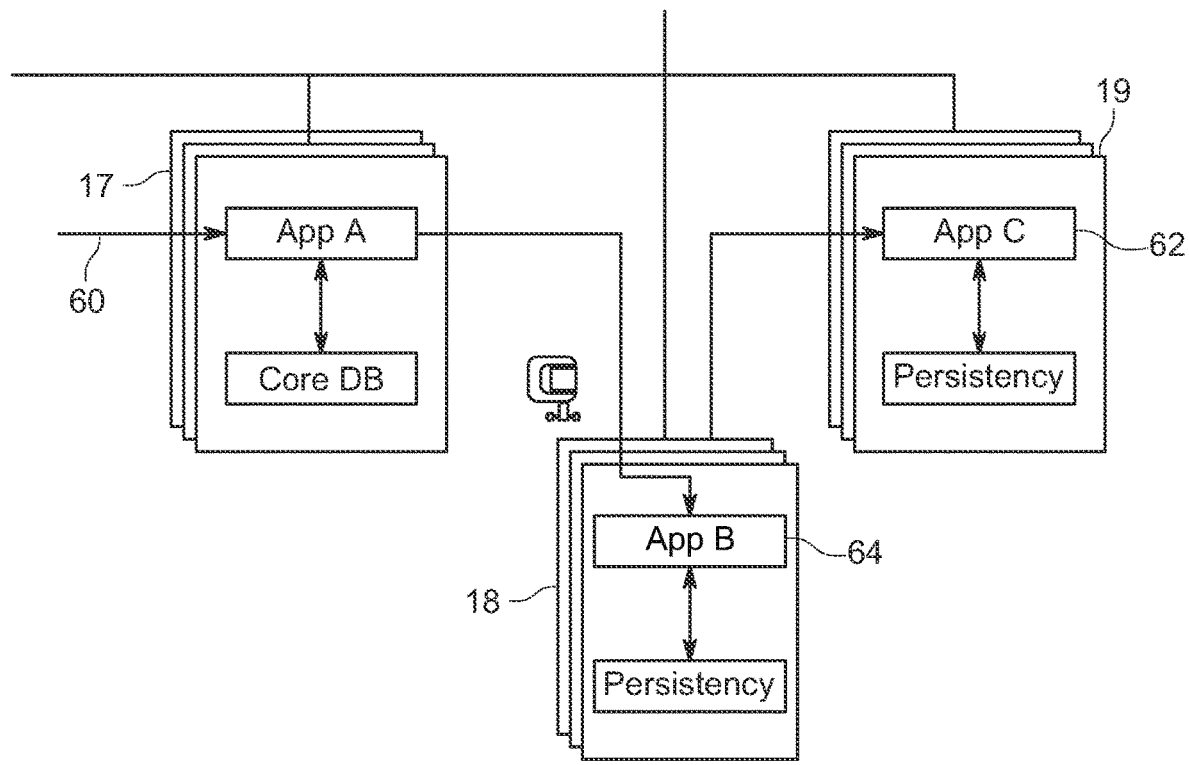
FIG. 6 illustrates an example of dynamic compression, according to some embodiments.

FIG. 6 illustrates an example of dynamic compression, according to some embodiments. In some embodiments, a use case for decompressing in App A 60 before transfer (of data). The App A 60 decompresses the data using a suitable decompression algorithm/process. The decompressed data is transferred over the network to App B 64. App B 64 receives the decompressed data. Potential performance factors: Decompression time in App A: X seconds; Data transfer time from App A to App B: Y seconds.

In one or more embodiments, another use case is described for decompressing in App B 64 after receiving compressed data from App A 60. App A 60 sends the compressed data (without decompression) to App B 64. App B 64 receives the compressed data and performs the decompression operation. The potential performance factors are as follows: data transfer time from App A 60 to App 64: Y seconds; decompression time in App B 64: Z seconds. In this use case, the time taken for compression in App A 60 is the same in this and the previous described use case. The key difference lies in the data transfer time and decompression time in App B 64.

In one or more embodiments, yet another use case is described for multi-system data exchange with compression and decompression. App A 60 compresses the data using a suitable compression algorithm. The compressed data is transferred over the network to App B 64. App B 64 receives the compressed data and performs the decompression operation. App B 64 then re-compresses the data using a different compression algorithm. The re-compressed data is transferred over the network to App C 62. App C 62 receives the re-compressed data and performs the final decompression operation. The potential performance factors are as follows: compression time in App A 60: X seconds; data transfer time from App A 60 to App B 64: Y seconds; decompression time in App B 64: Z seconds; compression time in App B 64: W seconds; data transfer time from App B 64 to App C 62: V seconds; decompression time in App C 62: U seconds. The system cost considerations are as follows: data transfer cost from App A 60 to App B 64: Cost1; data transfer cost from App B 64 to App C 62: Cost2.

In some embodiments, the global compression manager 13 (FIGS. 1, 4 and 5) depends on the characteristics of system setup, network conditions, and the chosen compression one or more algorithms/processes to dynamically decide on adaptive compression. The following equation may be utilized by one or more embodiments:

$$\text{Total cost} = \sum_{i=1}^{m}\left((CPU_i * w_i) + \right.$$
$$\left. \sum_{j=1}^{m}\left((\text{Query}_j * w_j) + \sum_{k=1}^{m}\left((\text{Network}_k * w_k) + \sum_{l=1}^{m}((\text{Storage}_l * w_l)\right.\right.\right.$$

where the total cost includes the total system cost of every element in database, including CPU cost for computation, query cost for caching and searching, network cost for transferring data in different components, and storage costs for persistency. The w parameter refers to the weight for each contributor to calculate the total cost in database. In some embodiments, the weight varies depending on different database type, such as online transaction processing (OLTP) or online analytical processing (OLAP), etc. In one or more embodiments, if the data transfer time (Y) is relatively high due to limited network bandwidth or high network latency, the first use case (decompressing in App A 60 before transfer) may have an advantage. This is because App B 64 receives uncompressed data, reducing the decompression time (Z) on its end. However, if the network has sufficient bandwidth and low latency, the second use case (sending compressed data to App B 64 for decompression) may be more efficient. In this case, the data transfer time (Y) would be relatively shorter compared to the decompression time (Z) in App B 64.

Figure 7:
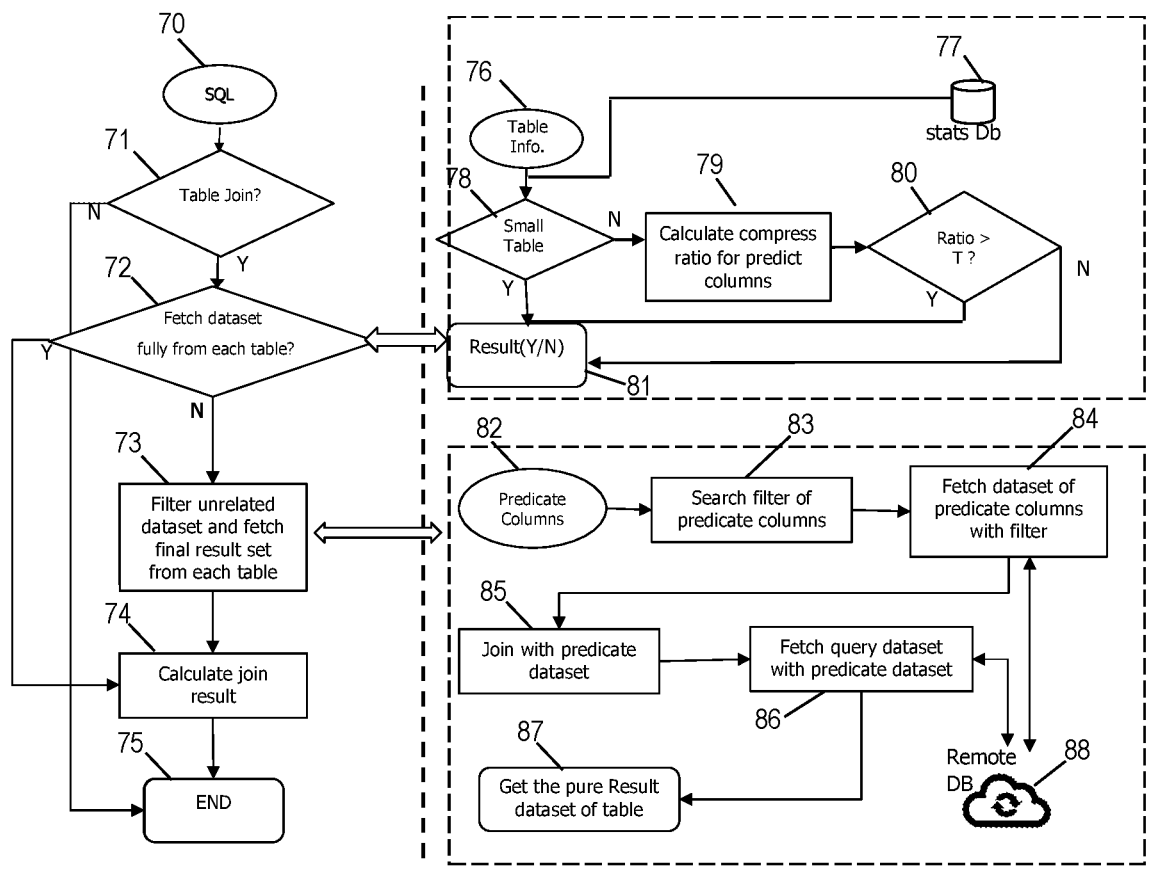
FIG. 7 illustrates a workflow for the distributed database system diagram, according to some embodiments.

FIG. 7 illustrates a workflow diagram for the distributed database system, according to some embodiments. In one or more embodiments, the workflow starts at structured query language (SQL) 70 (a standard language for database creation and manipulation), which is used to store, retrieve, manage and manipulate data within a database management system. In block 71, it is determined whether a table in a database is a join table (a data table that has multiple outgoing connections-connecting multiple data tables to one data table) or not. If the database is not a join table, the workflow proceeds to block 75 and the process ends. Otherwise, in some embodiments the workflow proceeds to block 72 where it is determined whether a dataset is fully fetched from each table in a database. If it is determined that a dataset is fully fetched from each table in the database, the workflow proceeds to block 74 where a join result is calculated. Otherwise, the workflow proceeds to block 73 where unrelated datasets are filtered and a final result set is fetched from each table. The workflow then proceeds to block 74.

In one or more embodiments, in block 76, the table information is obtained for the workflow with data from the statistics (stats) database 77. In block 78, it is determined whether the table is considered a small table or not. A small table means that the table is tiny (e.g., fits in a spreadsheet) and there is obvious difference before and after compression. If it is determined that the table is not small, the workflow proceeds to block 79 where the compress ratio for the predict columns is calculated. The workflow proceeds to block 80 where it is determined whether a ratio is greater than T, where T is the threshold to check if the predicted compression ratio is larger than the threshold. If the ratio is not greater than T, the workflow proceeds to block 81 with the result of N. Otherwise, the workflow proceeds to block 81 with the result of Y. The result in block 81 is utilized by block 72. As can be seen, there are two kinds of output: 1) Y: refers to being able to fetch a database fully from each table; 2) N refers to filtering an unrelated database and fetching a final result set.

In some embodiments, in block 82, predicate (A predicate is a condition expression that evaluates to a boolean value, either true or false) columns are utilized by block 83 that provides a search filter of predicate columns. In block 84, the workflow fetches a dataset of predicate columns with the search filter. The workflow proceeds to block 85 that performs a join operation with a predicate dataset. In block 86 the workflow provides fetching of a query dataset with a predicate dataset. In block 87 the workflow gets the pure result dataset of a table. Remote database 88 provides the dataset to block 84 and block 86. The final result set from block 87 is utilized by block 73.

In one or more embodiments, the system continuously monitors the performance of the compression and decompression operations. The system analyzes factors such as CPU utilization, storage savings, data transfer system costs, and query response times. Based on this analysis, the system may dynamically adjust the compression parameters to optimize performance. The performance monitoring processing portion contains the performance metrics for compression and decompression operations. In some embodiments, the following pseudo-code may be utilized by the system:

```
{
    "performanceMonitoring": {
        "compression": {
            "cpuUtilization": 0.75,
            "storageSavings": 0.6,
            "dataTransferCosts": {
                "incoming": 100,
                "outgoing": 80
            }
        },
        "decompression": {
            "cpuUtilization": 0.6,
            "queryResponseTimes": {
                "average": 50,
                "max": 100
            }
        }
    },
    "compressionParameters": {
        "algorithm": "gzip",
        "compressionLevel": 5
    }
}
```

In some embodiments, under compression, cpuUtilization represents the CPU utilization during compression operations (e.g., value 0.75 means 75% CPU utilization); storageSavings indicates the percentage of storage space saved through compression (e.g., value 0.6 means 60% storage savings); dataTransferCosts provides the data transfer costs associated with compression; incoming represents the cost of incoming data transfer (e.g., value 100); and outgoing represents the cost of outgoing data transfer (e.g., value 80).

In one or more embodiments, under decompression, cpuUtilization represents the CPU utilization during decompression operations (e.g., value 0.6 means 60% CPU utilization); queryResponseTimes provides the response time metrics for queries involving decompressed data; average represents the average query response time (e.g., value 50); and max represents the maximum query response time (e.g., value 100).

In some embodiments, the compressionParameters section contains the current compression parameters that may be dynamically adjusted based on performance analysis where algorithm represents the compression algorithm/process used (e.g., "gzip"); and compressionLevel represents the compression level or parameters (e.g., value 5).

One or more embodiments dynamically adjust the compression switch and level based on the characteristics of the data and distributed database systems. The data is analyzed to determine its characteristics, such as data type, distribution, and statistical properties. The distributed database system analyzes the data to determine its characteristics, such as data type, distribution, and statistical properties. This analysis assists in understanding the compressibility potential of the data. The compression level is adjusted based on factors such as available system resources, desired storage savings, and performance requirements. Some embodiments dynamically adjust the compression switch and level based on factors such as available system resources, desired storage savings, and performance requirements. The compression level may vary dynamically depending on the data being processed and the workload on the system. In one or more embodiments, the system may provide for table-level compression, column-level compression, index compression, and may also utilize external compression tools.

Some embodiments provide for continuously monitoring the performance of the compression and decompression operations. The system analyzes factors such as CPU utilization, storage savings, data transfer costs, and query response times. The system continuously monitors the performance of the compression and decompression operations. The system analyzes factors such as CPU utilization, storage savings, data transfer costs, and query response times. Based on this analysis, the system may dynamically adjust the compression parameters to optimize performance. The performance monitoring portion of processing contains the performance metrics for compression and decompression operations.

FIG. 8 illustrates a process 90 for using a computing device to provide adaptive compression and decompression for distributed database applications, according to an embodiment. In one embodiment, in block 91, process 90 performs analyzing, by a computing device, data to determine its characteristics. In block 92, process 90 performs selecting, by the computing device, at least one compression process based on the characteristics. In block 93, process 90 performs dynamically adjusting a compression switch and a compression level based on multiple factors including available system resources, desired storage savings, and performance requirement. The compression level dynamically varies depending on the data being processed and the workload on the system. In block 94, process 90 performs continuously monitoring performance of compression and decompression operations for dynamically adjusting compression parameters to optimize performance. Thus, process 90 achieves optimizing the utilization of system resources across multiple systems involved in the compression and decompression process. This helps ensure that the overall resource usage is balanced, and no system is overloaded or underutilized. Identify opportunities for cost optimization by understanding the costs associated with data transfer, compression, and decompression across systems. Process 90 contributes to the advantage of identification of bottlenecks or areas of inefficiency by factoring in the costs associated with data transfer and compression/decompression operations. Process 90 further contributes to the advantage of dynamically adjusting the compression switch and level based on the characteristics of the data and distributed database systems, which ensures global optimization instead of unfair cost.

In one or more embodiments, process 90 may include the feature that the characteristics comprise data type, distribution, and statistical properties, and the characteristics provide information for compressibility potential of the data.

In some embodiments, process 90 may further include the feature that the multiple factors includes available system resources, desired storage savings, and performance requirement.

In one or more embodiments, process 90 may further include the feature that the continuously monitoring of the performance of the compression and the decompression operations provide analysis for multiple factors.

In some embodiments, process 90 may include the feature that the multiple factors include CPU utilization, storage savings, data transfer system usage, and query response times.

In one or more embodiments, process 90 may further include a global compression manager that controls where and how to compress from a whole system perspective.

In some embodiments, process 90 may additionally include the feature that the global compression manager depends on characteristics of system setup, network conditions and the at least one compression process to dynamically apply adaptive compression, where the data characteristics change over time.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 9:
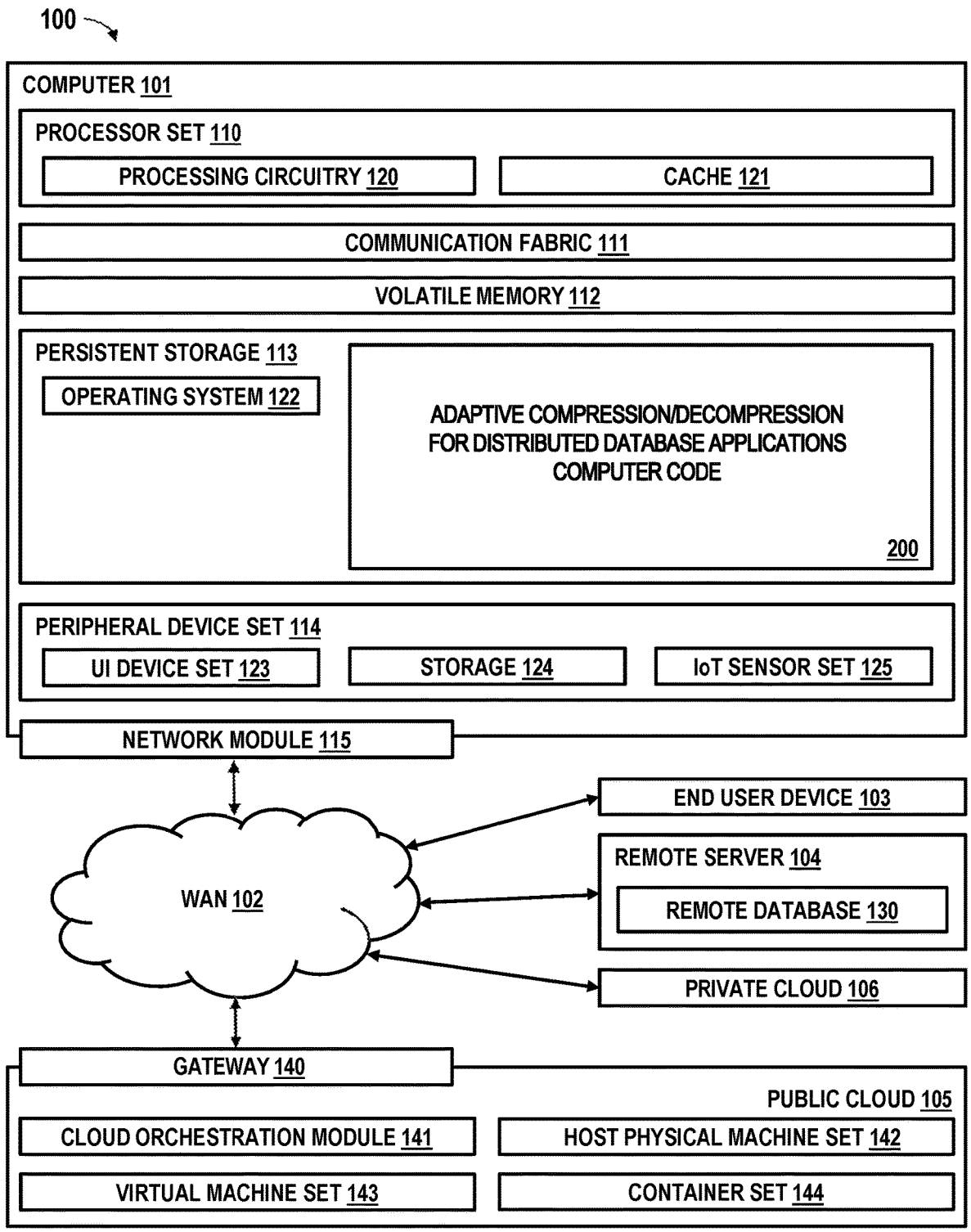
FIG. 9 illustrates an example computing environment utilized by one or more embodiments.

FIG. 9 illustrates an example computing environment 100 utilized by one or more embodiments. Computing environment 100 contains an example of an environment for the execution of at least some of adaptive compression/decompression for distributed database applications computer code 200 involved in performing the inventive methods. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up buses, bridges, physical input/output ports and the like. Other types of signal communication paths may be used, such as fiber optic communication paths and/or wireless communication paths.

VOLATILE MEMORY 112 is any type of volatile memory now known or to be developed in the future.

Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

What is claimed is:

1. A method comprising:
   determining, by a computing device, data characteristics and network characteristics of data transferring within a multi-system data exchange, wherein the data characteristics are related to compressibility potential;
   selecting, by the computing device, a first compression process based on the data characteristics and network characteristics for a first exchange between a first app and a second app, and a second compression process based on the characteristics and network characteristics for a second exchange between the second app and a third app;
   dynamically adjusting compression parameters comprising: a compression switch, a compression algorithm, and a compression level based on a plurality of factors comprising available system resources, the characteristics of the data, desired storage savings, and performance requirement, wherein the compression parameters dynamically adjust within the first app, the second app, and the third app depending on currently-determined characteristics of the data being processed and a currently-detected workload on the muti-system data exchange; and
   monitoring performance of compression and decompression operations for dynamically adjusting the compression parameters within the first app, the second app, and the third app to optimize performance.

2. The method of claim 1, wherein the characteristics comprise data type, distribution, and statistical properties, and the characteristics provide information for compressibility potential of the data.

3. The method of claim 1, wherein the monitoring of the performance of the compression and the decompression operations provides analysis for the plurality of factors.

4. The method of claim 1, wherein the plurality of factors further comprises central processing unit (CPU) utilization, storage savings, data transfer system usage, and query response times.

5. The method of claim 1, wherein a global compression manager controls where and how to compress from a whole system perspective.

6. The method of claim 5, wherein the global compression manager depends on characteristics of system setup, network conditions, and the at least one compression process to dynamically apply adaptive compression.

7. The method of claim 6, wherein the data characteristics change over time.

8. A computer program product for providing adaptive compression and decompression for distributed database applications, the computer program product comprising a computer readable storage medium having program instructions embodied therewith, the program instructions executable by a processor to cause the processor to:

determine data characteristics and network characteristics of data transferring within a multi-system data exchange, wherein the data characteristics are related to compressibility potential;

select a first compression process based on the data characteristics and network characteristics for a first exchange between a first app and a second app, and a second compression process based on the characteristics and network characteristics for a second exchange between the second app and a third app;

dynamically adjusting compression parameters comprising: a compression switch, a compression algorithm, and a compression level based on a plurality of factors comprising available system resources, the characteristics of the data, desired storage savings, and performance requirement, wherein the compression parameters dynamically adjust within the first app, the second app, and the third app depending on currently-determined characteristics of the data being processed and a currently-detected workload on the muti-system data exchange; and monitoring performance of compression and decompression operations for dynamically adjusting the compression parameters within the first app, the second app, and the third app to optimize performance.

9. The computer program product of claim 8, wherein the characteristics comprise data type, distribution, and statistical properties, and the characteristics provide information for compressibility potential of the data.

10. The computer program product of claim 8, wherein the monitoring of the performance of the compression and the decompression operations provide analysis for the plurality of factors.

11. The computer program product of claim 8, wherein the plurality of factors further comprises central processing unit (CPU) utilization, storage savings, data transfer system usage, and query response times.

12. The computer program product of claim 8, wherein a global compression manager controls where and how to compress from a whole system perspective.

13. The computer program product of claim 12, wherein the global compression manager depends on characteristics of system setup, network conditions, and the at least one compression process to dynamically apply adaptive compression.

14. The computer program product of claim 13, wherein the data characteristics change over time.

15. A system comprising:
a memory configured to store instructions; and
a processor configured to execute the instructions to:
determine data characteristics and network characteristics of data transferring within a multi-system data exchange, wherein the data characteristics are related to compressibility potential;

select a first compression process based on the data characteristics and network characteristics for a first exchange between a first app and a second app, and a second compression process based on the characteristics and network characteristics for a second exchange between the second app and a third app;

dynamically adjusting compression parameters comprising: a compression switch, a compression algorithm, and a compression level based on a plurality of factors comprising available system resources, the characteristics of the data, desired storage savings, and performance requirement, wherein the compression parameters dynamically adjust within the first app, the second app, and the third app depending on currently-determined characteristics of the data being processed and a currently-detected workload on the muti-system data exchange; and monitoring performance of compression and decompression operations for dynamically adjusting the compression parameters within the first app, the second app, and the third app to optimize performance.

16. The system of claim 15, wherein the characteristics comprise data type, distribution, and statistical properties, and the characteristics provide information for compressibility potential of the data.

17. The system of claim 16, wherein the monitoring of the performance of the compression and the decompression operations provide analysis for the plurality of factors.

18. The system of claim 17, wherein the plurality of factors further comprises central processing unit (CPU) utilization, storage savings, data transfer system usage and query response times, and a global compression manager controls where and how to compress from a whole system perspective.

19. The system of claim 18, wherein the global compression manager depends on characteristics of system setup, network conditions, and the at least one compression process to dynamically apply adaptive compression.

20. The system of claim 19, wherein the data characteristics change over time.

* * * * *